(12) United States Patent
Iketaki

(10) Patent No.: US 7,759,613 B2
(45) Date of Patent: Jul. 20, 2010

(54) REFLOWING APPARATUS AND REFLOWING METHOD

(75) Inventor: Kenji Iketaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 11/878,537

(22) Filed: Jul. 25, 2007

(65) Prior Publication Data

US 2007/0267465 A1    Nov. 22, 2007

Related U.S. Application Data

(63) Continuation of application No. PCT/JP2005/002738, filed on Feb. 21, 2005.

(51) Int. Cl.
| F27B 9/10 | (2006.01) |
| F27B 9/36 | (2006.01) |
| F27D 7/04 | (2006.01) |
| B23K 1/012 | (2006.01) |
| B23K 31/02 | (2006.01) |
| H05K 3/34 | (2006.01) |

(52) U.S. Cl. .................. 219/388; 219/400; 219/404; 228/180.1; 228/26

(58) Field of Classification Search ................ None
See application file for complete search history.

(56) References Cited

U.S. PATENT DOCUMENTS

| 4,833,301 A | * | 5/1989 | Furtek ........................ 219/388 |
| 6,005,223 A | * | 12/1999 | Ogihara ...................... 219/388 |
| 6,402,011 B1 | * | 6/2002 | Taniguchi et al. ......... 228/180.1 |
| 7,307,243 B2 | * | 12/2007 | Farkas et al. ................ 219/388 |

FOREIGN PATENT DOCUMENTS

| CN | 2610598 Y | 4/2004 |
| JP | 09-246712 A | 9/1997 |
| JP | 2000-022325 A | 1/2000 |
| JP | 2001-237538 A | 8/2001 |
| JP | 2001-320163 A | 11/2001 |
| JP | 2001-358454 A | 12/2001 |
| JP | 2002-016352 A | 1/2002 |
| JP | 2002-324972 A | 11/2002 |
| JP | 2005028424 A | * | 2/2005 |

OTHER PUBLICATIONS

JP09-246712A, Sep. 1997, Japan, Masato et al, partial translation.*

* cited by examiner

*Primary Examiner*—Joseph M Pelham
(74) *Attorney, Agent, or Firm*—Arent Fox LLP

(57) ABSTRACT

A reflowing apparatus for mounting parts on a printed wiring board, has a fixed heating portion for blowing the hot air to the printed wiring board, and a moving heating portion for locally varying the temperature of the hot air blown by the fixed heating portion to the printed wiring board.

14 Claims, 10 Drawing Sheets

Fig. 2
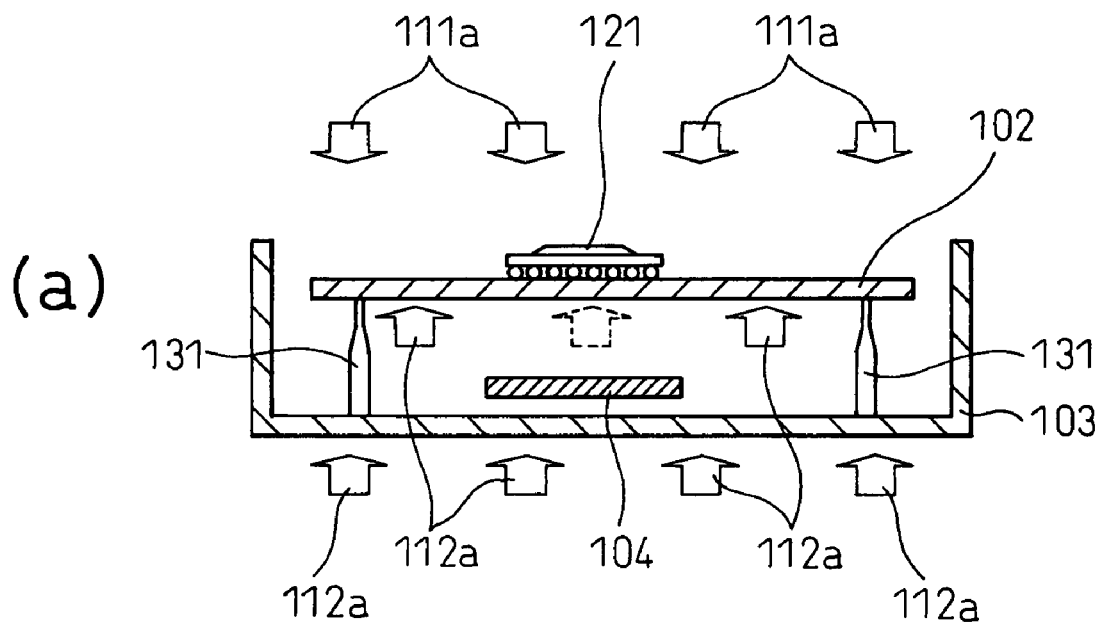
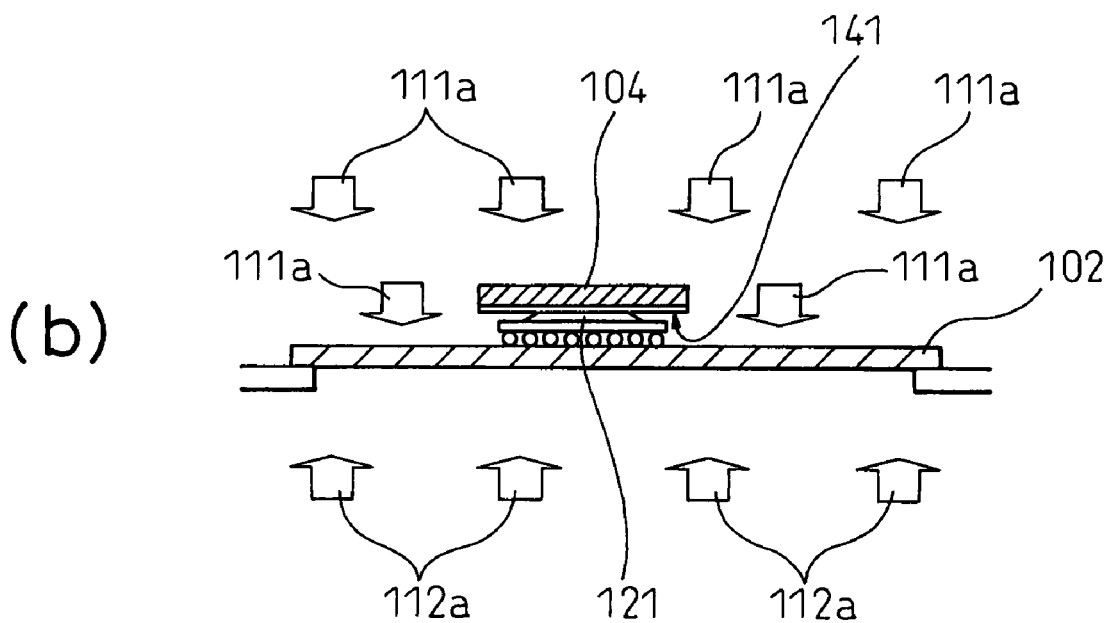

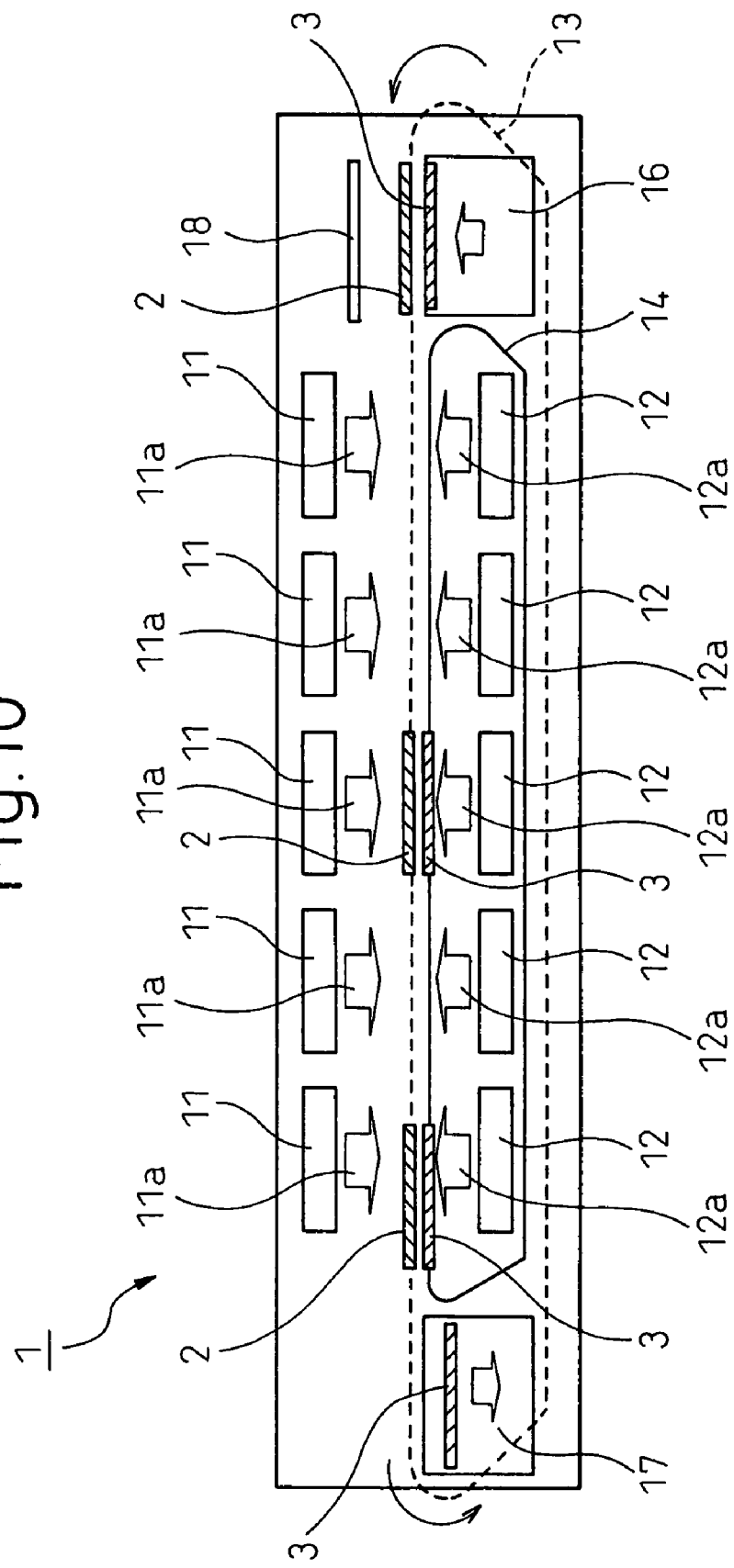

REFLOWING APPARATUS AND REFLOWING METHOD

CROSS-REFERENCE TO RELATED APPLICATION

This application is a continuation application and is based upon PCT/JP05/02738, filed on Feb. 21, 2005.

BACKGROUND OF THE INVENTION

1. Field of the Invention

The present invention relates to a reflowing apparatus and a reflowing method for mounting parts on a printed wiring board.

2. Description of the Related Art

Recently, it is a worldwide trend to abandon the use of harmful substances from the production of electronic products in a drive to keep up with the global environment, and it is becoming essential to use a "lead-free solder" instead of using "lead-containing solder" for joining electronic products to the printed wiring boards.

The lead-free solder, however, must be treated at a temperature higher than the temperatures for the ordinary solders. Concretely speaking, the conventional eutectic solder has a melting point of 183° C. in the case of, for example, the lead-containing solder whereas the lead-free solder has a melting point of about 206° C. in the case of the "tin-silver-bismuth-indium (Sn—Ag—Bi—In)" solder and a melting point of about 220° C. in the case of the "tin-silver-copper (Sn—Ag—Cu)" solder. Besides, the solder tends to exhibit poor wet-spreading property and, therefore, the parts and materials must have higher heat resistance so will not to exhibit deteriorated properties.

As the electronic products are becoming highly functional in recent years, further, differences are increasing in the soldering temperature depending upon the kinds and sizes of parts mounted on the printed wiring board and upon the degree of packaging density. In particular, the power source circuit employs parts many of which having large heat capacities, such as ferrite coils, and the temperature does not increase so much at the junction portions. In the LSIs and memories having small heat resistance, on the other hand, parts have been fabricated in ever small sizes and in ever small thicknesses, and the temperature of parts increases at the time of soldering. Thus, the problem is becoming serious concerning an increase in the difference of temperatures and out of balance of temperatures.

Effort has now been made to produce parts which are highly heat resistant but it is difficult to provide parts which satisfy differences in the reflowing temperature under all conditions. Therefore, it has been strongly urged to provide means for solving the difference of temperature at the time of reflowing from the standpoint of producing all electronic products without using lead.

FIG. 1 is a view schematically illustrating a conventional reflowing apparatus, wherein reference numeral 101 denotes a reflowing apparatus, 102 denotes printed wiring boards, 111 and 112 denote heaters, 111a and 112a denote hot airs, and 113 denotes a board conveyer.

Referring to FIG. 1, the conventional reflowing apparatus 101 includes hot air heaters/infrared ray heaters 111 and 112 for heating provided over and under the printed wiring boards 101 that are conveyed by the board conveyer 113, wherein the hot airs 111a and 112a are blown onto the printed wiring boards 102; i.e., the printed wiring boards 102 are heated under the uniform conditions by controlling the temperatures of the heaters 111 and 112.

Here, the individual printed wiring boards 102 are heated under different heating conditions depending upon the density of the parts, specific heat, coefficient of heat conduction, absorbency for infrared rays and arrangement of the mounted parts. That is, if the printed wiring boards 102 are heated under the uniform heating condition, difference in the temperature occurs among the parts, and between the soldered portions and the parts. Further, when the lead-free solder is used as described above, the temperature difference becomes more conspicuous due to an increase in the junction temperature casting a barrier against the effort for abandoning the use of lead.

To cope with this problem, the soldering treatment has, so far, been manually carried out separately from the reflowing work (reflow soldering work) for the power source circuit that included ferrite coils having large heat capacities permitting the temperature to rise less at the junction portions. Or, the printed wiring board as a whole is heated to meet the junction portions where the temperature does not rise so much while providing a shielding plate for the portions where parts are mounted which may be so heated as to exceed their bearable temperatures in order to suppress the rise of temperature.

FIG. 2 is a view schematically illustrating a state of using the shielding plate in the reflowing apparatus of FIG. 1, wherein FIG. 2(a) illustrates a case where the shielding plate 104 is provided under the printed wiring board 102 and FIG. 2(b) illustrates a case where the shielding plate 104 is provided over the printed wiring board 102.

Here, the reflowing condition (reflow soldering work) is set to meet the soldering material that uses the minimum temperature of the junction portions, and is set to be, for example, about 230° C. in the case of the Sn—Ag—Cu solder. Usually, parts of large heat capacities such as coil in the power source system, module parts and junction portions of large connectors, are the low-temperature parts. Further, the temperature of the parts at the time of reflow soldering becomes higher than the temperature of the junction portions. Besides, parts of which the heat conditions must be controlled have bearable temperatures which are, usually, 235° C. to 245° C. and, therefore, many parts are subject to be heated beyond their bearable temperatures.

Referring to FIG. 2(a), the printed wiring board 102 is placed on a pallet 103 via a plurality of pins 131. Here, when the printed wiring board as a whole is to be heated to meet the low-temperature parts such as coils in the power source system of which the temperature does not rise so quickly, a semiconductor integrated circuit 121 is heated in excess of its bearable temperature. Therefore, the shielding plate 104 is arranged under the semiconductor integrated circuit 121 to shield the hot air from the lower side, so that the temperature of the semiconductor integrated circuit 121 is not excessively elevated.

Further, as shown in FIG. 2(b), the shielding plate 104 is stuck by using, for example, a heat resistant double-sided adhesive tape 141 onto the semiconductor integrated circuit 121 mounted on the printed wiring board 102 to shield the hot air from the upper side, so that the temperature of the semiconductor integrated circuit 121 is not excessively elevated.

As described above, when the printed wiring board as a whole is to be heated to meet the low-temperature parts such as coils in the power source system of which the temperature does not rise so quickly, the shielding plate 104 is provided for the part 121 which will be heated in excess of its bearable temperature so as to shield the hot air blown to the part 121 from the upper side thereof or from the lower side thereof to suppress the part 121 from being excessively heated.

However, when there are a plurality of parts that use the shielding plates 104, the heating efficiency greatly drops around the shielding plates 104 and the solder is not often melted. In the case of FIG. 2(b), the printed wiring board 102 warps due to an increased weight caused by the shielding plate 104, or the soldering is not perfectly effected and the quality drops.

There has further been proposed a reflowing apparatus which is capable of decreasing the temperature difference between the mounted part that can be easily heated and the mounted part that is not heated so quickly (see, for example, patent document 1).

FIG. 3 is a view schematically illustrating another conventional reflowing apparatus, i.e., illustrating the reflowing apparatus disclosed in the patent document 1.

Referring to FIG. 3, the conventional reflowing apparatus 101 includes a plurality of infrared-ray heaters 115 and 116 over and under the printed wiring boards 102 conveyed by the board conveyer 113, and block-like infrared-ray heaters 117 and 118 over and under a main heating unit HA in the furnace body for heating the printed wiring boards 102, so as to heat the printed wiring boards 102 conveyed by the board conveyer 113 by taking the rate of conveyance into consideration and in compliance with a temperature distribution pattern. The upper infrared-ray heaters 115 and the block-like infrared-ray heater 117 are provided with stirrer fans 114.

Further, the patent document 1 teaches mounting a temperature distribution pattern for decreasing the dispersion of temperature caused by the kinds and positions of parts on the printed wiring board on a heating pallet equipped with a heating unit which comprises a plurality of infrared-ray heaters, and executing the reflowing by conveying the heating pallet by the board conveyer.

Patent Document 1: JP-2002-324972-A (FIGS. 1 and 5)

As described above, there has heretofore been proposed the reflowing apparatus which effects the reflow soldering by imparting heating conditions that differ depending upon the blocks to the block-like infrared-ray heaters, and heating the printed wiring board depending upon the temperature distribution.

However, the conventional reflowing apparatus uses the infrared-ray heaters and the stirrer fans, the infrared-ray heaters having a slow speed of response. To vary the temperature conditions of the heaters, therefore, a time of several minutes is required at the shortest. Further, the heat radiated from the infrared-ray heaters interferes among the blocks making it difficult to effect local heating. It is further difficult to effect the control in synchronism with the speed of conveying the printed wiring boards, making the apparatus far from of practical use.

FIG. 4 is a view illustrating an example of a simulated temperature distribution at the time of reflow soldering in a conventional reflowing apparatus, and illustrates a temperature distribution of a printed wiring board 201 used for a notebook personal computer of when the hot air is blown to the entire board.

In FIG. 4, reference numerals TA1, TA2, TA3 and TA4 are temperature distributions maintaining a temperature relationship of TA1>TA2>TA3>TA4.

That is, the temperature becomes high at portions TA1 where no part is mounted or where a semiconductor integrated circuit 211 having a small heat capacity is mounted, and the temperature becomes slightly low at portions TA2 where a mounting density of parts is high or parts having slightly large heat capacities are mounted. The temperature becomes further low at portions TA3 where a connector 212 having a relatively large heat capacity is provided, and becomes the lowest at portions TA4 where, for example, power source ferrite coils 213 are mounted.

As will be obvious from FIG. 4, a large proportion of the printed wiring board 201 is forming high-temperature portions (particularly, TA1) compared to the low-temperature portions (particularly, TA4).

According to the above method of setting the temperature of the low-temperature portions (usually, soldering portions) to the minimum temperature that maintains reliability while shielding the parts that are excessively heated, the high-temperature portions are wider than the low-temperature portions and, therefore, wide regions must be shielded. Therefore, problems arouse concerning not only the shielding but also elevating the heater temperatures and setting the temperature conditions to meet the overall increase in the heat capacities.

In view of the above problems inherent in the conventional reflow technologies, it is an object of the present invention to provide a reflowing apparatus which is capable of effecting the reflowing for the whole printed wiring board without causing parts to be heated in excess of their bearable temperatures by lowering the dispersion of temperature at the time of soldering that stems from the kinds and sizes of parts mounted on the printed wiring board and from the difference in the degree of packaging density, as well as to provide a reflowing method. In particular, it is the object of the invention to provide a reflowing apparatus adapted to using a lead-free solder which requires the treatment at a temperature higher than that of the ordinary solders and a reflowing method.

SUMMARY OF THE INVENTION

According to a first aspect of the present invention, there is provided a reflowing apparatus for mounting parts on a printed wiring board, comprising a fixed heating portion for blowing the hot air to the printed wiring board; and a moving heating portion for locally varying the temperature of the hot air blown by the fixed heating portion to the printed wiring board.

According to a second aspect of the present invention, there is provided a reflowing method of mounting parts on a printed wiring board by blowing the hot air from a fixed heating portion onto the printed wiring board, and by locally varying the temperature of the hot air blown from the fixed heating portion to the printed wiring board by using a moving heating portion.

The present invention provides a reflowing apparatus which is capable of effecting the reflowing (reflow soldering) for the whole printed wiring board without permitting parts to be heated in excess of their bearable temperatures by lowering the dispersion of temperature at the time of soldering that stems from the kinds and sizes of parts mounted on the printed wiring board and from the difference in the degree of packaging density, as well as to provide a reflowing method. In particular, the invention provides a reflowing apparatus adapted to using a lead-free solder which requires the treatment at a temperature higher than that of the ordinary solders and a reflowing method.

BRIEF DESCRIPTION OF THE DRAWINGS

FIG. 2 is a view schematically illustrating a state where shielding plates are used for the reflowing apparatus shown in FIG. 1;

FIG. 10 is a view illustrating how to control the moving heating portion in the embodiment of the reflowing apparatus according to the present invention.

Figure 1:
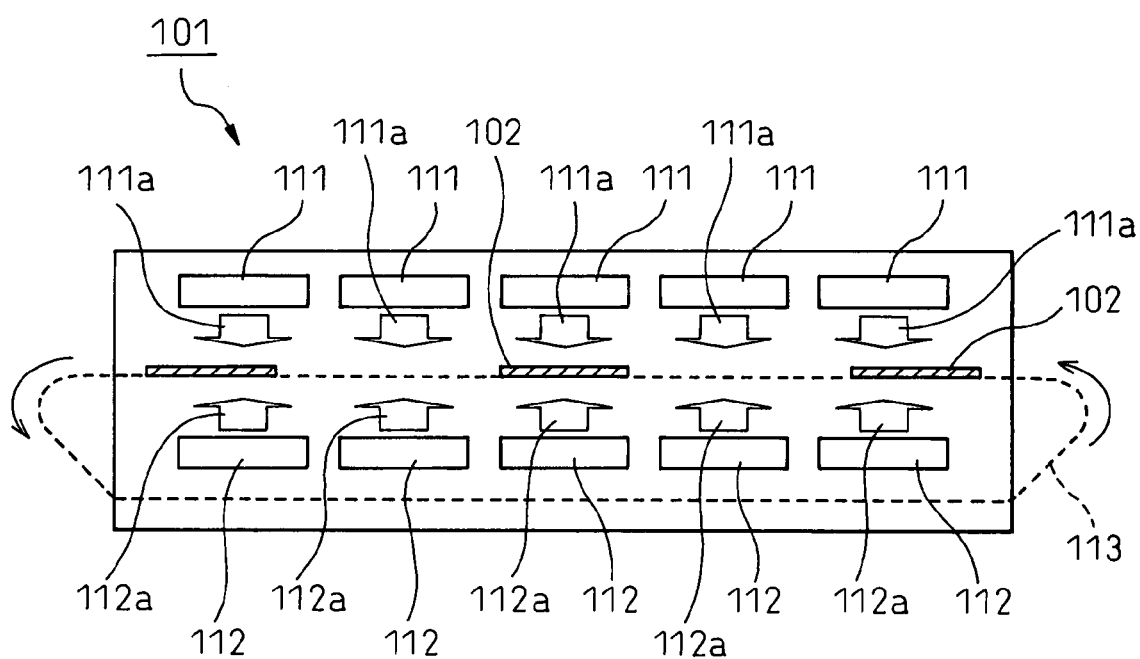
FIG. 1 is a view schematically illustrating a conventional reflowing apparatus.

DESCRIPTION OF NUMERALS 1 reflowing apparatus
2 printed wiring boards
3, 4 moving heating portions (moving heaters)
11, 12 fixed heating portions (fixed heaters)
13 board conveyer
14, 15 moving heater conveyers
31 base portion of the moving heater
32 heater unit

DESCRIPTION OF THE PREFERRED EMBODIMENTS

A reflowing apparatus of the present invention is for mounting parts on a printed wiring board, and comprises a fixed heating portion for blowing the hot air to the printed wiring board, and a moving heating portion for locally varying the temperature of the hot air blown by the fixed heating portion to the printed wiring board.

Embodiments of the reflowing apparatus and the reflowing method of the present invention will now be described with reference to the accompanying drawings.

Figure 5:
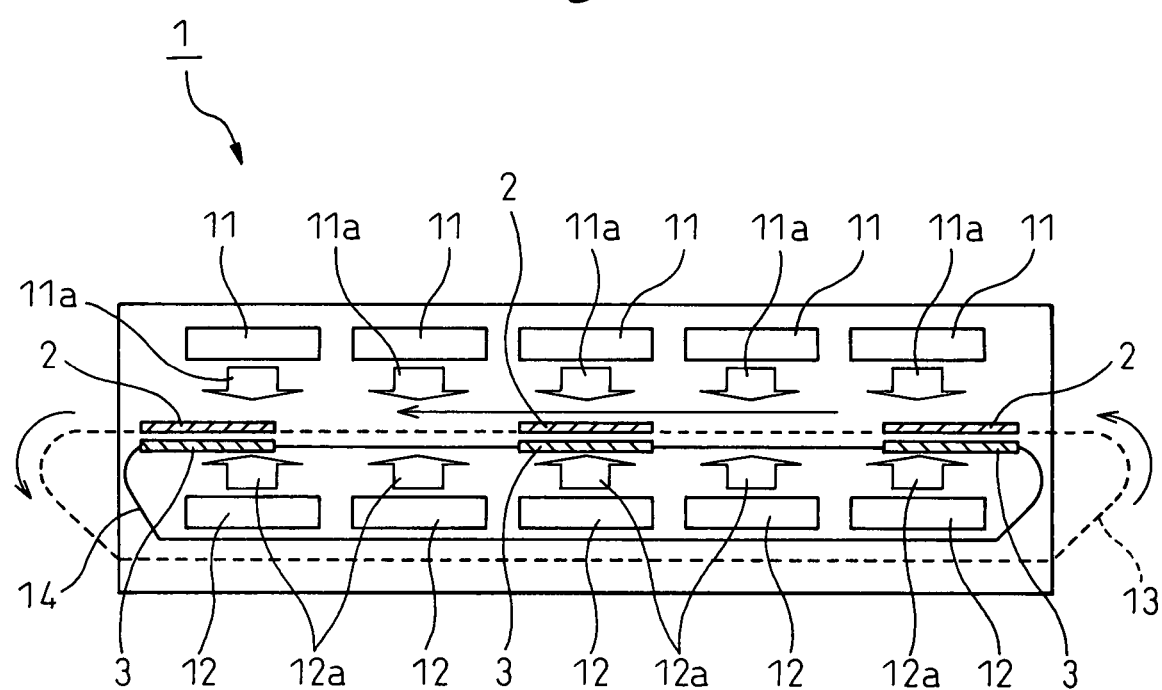
FIG. 5 is a view schematically illustrating an embodiment of a reflowing apparatus according to the present invention.

FIG. 5 is a view schematically illustrating an embodiment of the reflowing apparatus according to the present invention. In FIG. 5, reference numeral 1 denotes the reflowing apparatus, 2 denotes printed wiring boards, 3 denotes moving heating portions (moving heaters), 11 and 12 denote fixed heating portions (fixed heaters), 11a and 12a denote hot airs, 13 denotes a board conveyer, and reference numeral 14 denotes a conveyer for the moving heaters.

As will be obvious from the comparison of FIG. 5 with FIG. 1, the reflowing apparatus 1 of this embodiment basically includes fixed heaters 11 and 12 for heating provided over and under the printed wiring boards 2 conveyed by the board conveyer 13 like in the reflowing apparatus 101 of FIG. 1, blows hot airs 11a and 12a to the printed wiring boards 2, and heats the whole printed wiring boards 2 by controlling the temperatures of the heaters 11 and 12.

The reflowing apparatus 1 of this embodiment, further, includes moving heaters 3 that are moved by the moving heater conveyer 14 in synchronism with the printed wiring boards 2 conveyed by the board conveyer 13. The moving heaters 3 are provided under the printed wiring boards 2 and work to locally vary the temperature of the hot air 12a blown from the lower fixed heaters 12 to the printed wiring boards 2.

Figure 6:
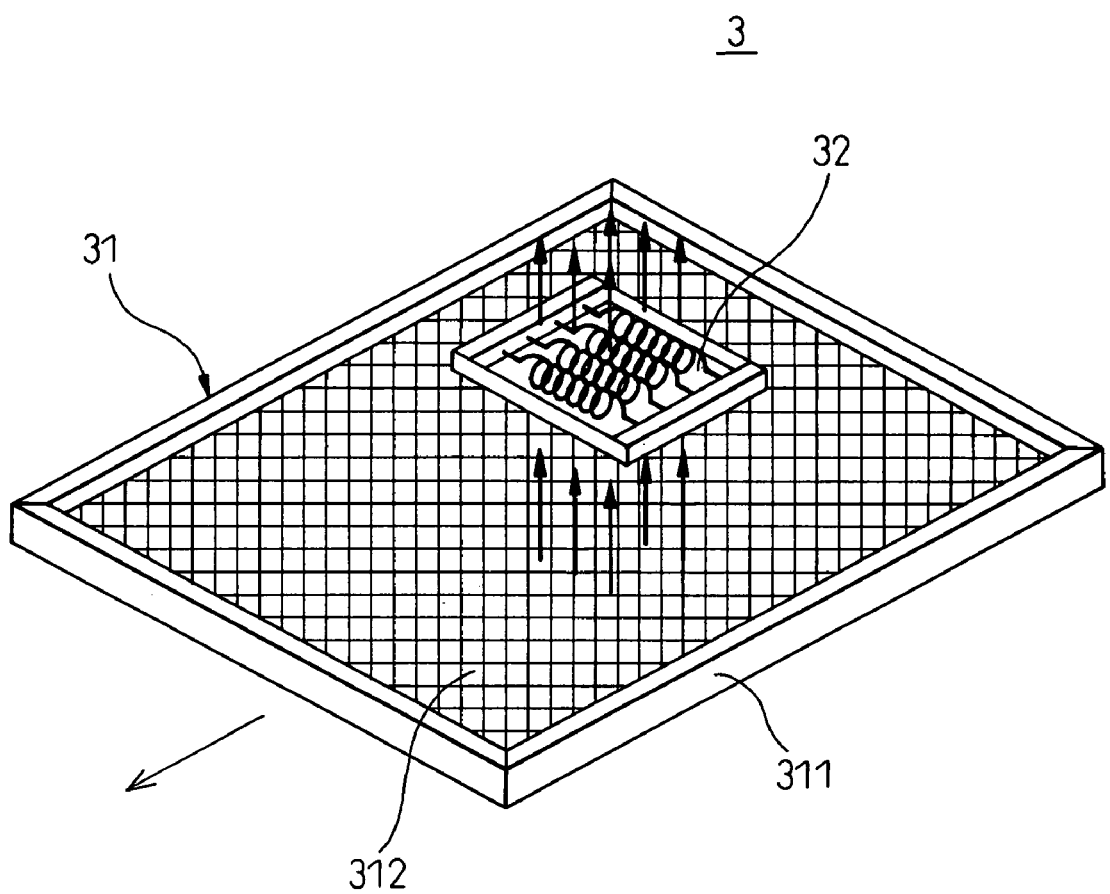
FIG. 6 is a view schematically illustrating a moving heating portion in the reflowing apparatus of FIG. 5.
Figure 7:
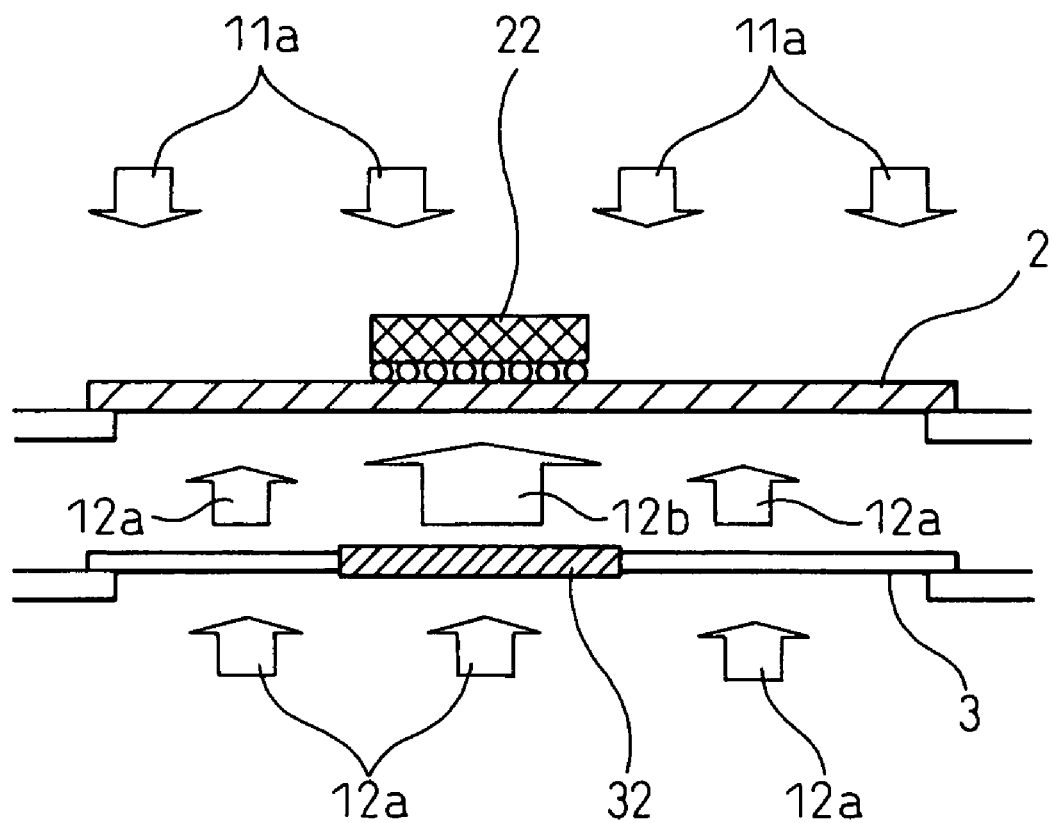
FIG. 7 is a view illustrating the operation of the reflowing apparatus of FIG. 5.

FIG. 6 is a view schematically illustrating a moving heating portion in the reflowing apparatus of FIG. 5, and FIG. 7 is a view illustrating the operation of the reflowing apparatus of FIG. 5.

Referring to FIG. 6, the moving heater 3 comprises a base portion 31 having a frame 311 and a punched plate 312, and a heater unit 32 arranged at any position on the base portion 31. The punched plate 312 may be a mesh plate which permits the hot air from the fixed heater 12 to pass through.

Referring to FIGS. 6 and 7, the heater unit 32 uses heating wires for locally elevating the temperature of the hot air from the fixed heater 12, and is provided at a position corresponding to a portion of a low-temperature part where, for example, a connector or a part 22 having a large heat capacity of the power source system is mounted, i.e., provided at a position corresponding to the low-temperature portion. Here, the number of the heater unit 32 is not limited to one only. For the printed wiring board 201 having a temperature distribution as shown in FIG. 4, for example, a first heater unit can be provided facing the low-temperature portion TA4 on the right side in the drawing, and a second heater unit can be provided facing the three low-temperature portions TA4 on the left side in the drawing.

The shape and size of the heater unit 32 are not limited to a predetermined rectangular shape only, but may assume various shapes and sizes. As for the position of the heater unit 32, the temperature distribution is simulated in advance as described above with reference to FIG. 4 for each of the printed wiring board 2 on which the reflow soldering is to be effected, and the heater unit 32 is arranged at a predetermined position on the base portion 31 corresponding to the low-temperature portion of the printed wiring board 2.

Figure 4:
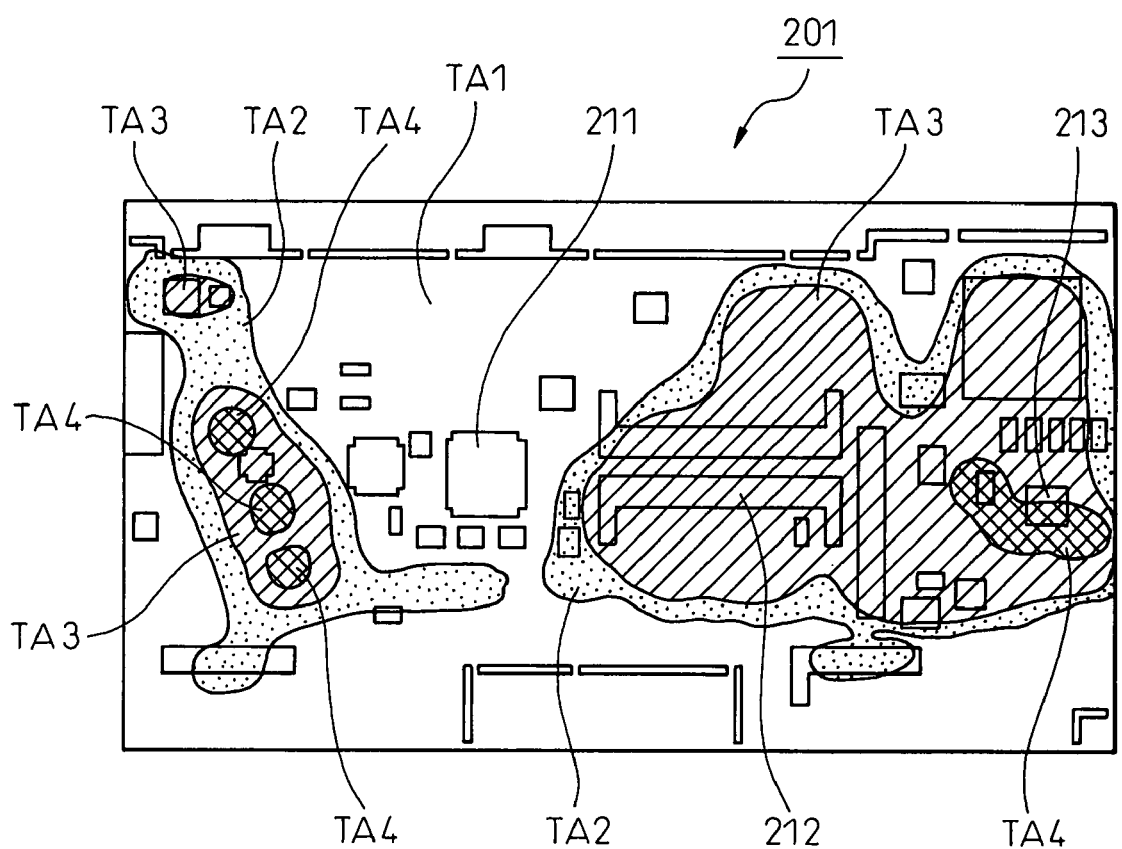
FIG. 4 is a view illustrating an example of a simulated temperature distribution at the time of reflow soldering in the conventional reflowing apparatus.

According to the reflowing apparatus of the first embodiment as described above, the hot airs 11a and 12a from the fixed heaters 11 and 12 effect the heating suited for the high-temperature parts on the printed wiring board 2, i.e., suited for the high-temperature portion TA1 in the simulated temperature distribution of FIG. 4 described above, and the moving heater 3 locally elevates the temperature of the hot air blown to the low-temperature portion of the printed wiring board 2.

This decreases the dispersion of temperature at the time of soldering caused by differences in the kind and size of parts mounted on the printed wiring board and in the degree of packaging density, and makes it possible to effect the reflowing (reflow soldering) for the printed wiring board as a whole without causing the parts to be heated in excess of their bearable temperatures.

Figure 8:
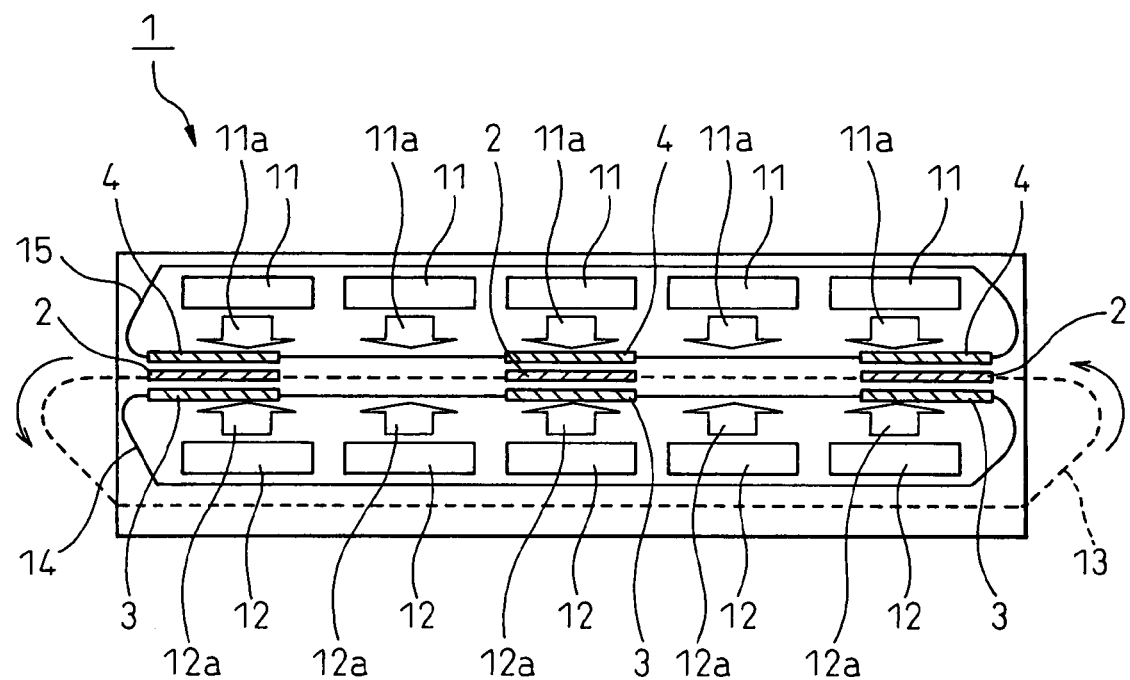
FIG. 8 is a view schematically illustrating another embodiment of the reflowing apparatus according to the present invention.

FIG. 8 is a view schematically illustrating another embodiment of the reflowing apparatus according to the present invention.

The reflowing apparatus shown in FIG. 8 is the same as the reflowing apparatus shown in FIG. 5 but further has a second moving heater conveyer 15 to move second moving heaters 4.

That is, the reflowing apparatus shown in FIG. 8 includes first moving heaters 3 under the board conveyer 13 for conveying the printed wiring boards 2, the first moving heaters 3 being moved by a first moving heater conveyer 14 in synchronism with the printed wiring boards 2, and includes second moving heaters 4 over the board conveyer 13 for conveying the printed wiring boards 2, the second moving heaters 4 being moved by a second moving heater conveyer 15 in synchronism with the printed wiring boards 2. The upper and lower two moving heaters 4 and 3 that move in synchronism with the printed wiring board 2 work to locally vary the temperatures of the hot airs 11a and 12a blown from the upper and lower heaters 11 and 12 to the printed wiring board 2.

Figure 9:
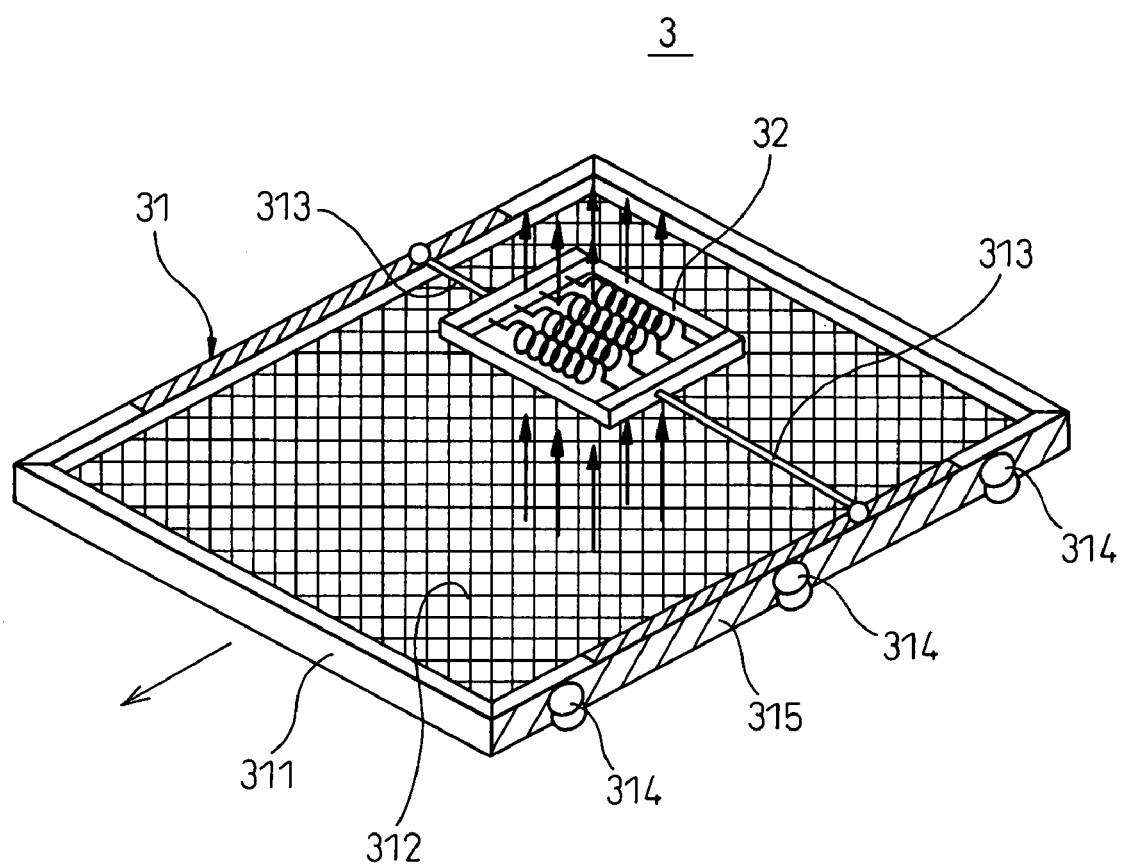
FIG. 9 is a view schematically illustrating a concrete constitution of the moving heating portion shown in FIG. 6.

FIG. 9 is a view schematically illustrating the concrete constitution of the moving heating portion shown in FIG. 6.

As described with reference to FIG. 6, the heater (moving heating portion) 3 comprises the base portion 31 having the frame 311 and the punched plate 312, and the heater unit 32 arranged at any position on the base portion 31. Here, the electric power is fed to the heater unit 32 by a constitution shown in, for example, FIG. 9.

Figure 3:
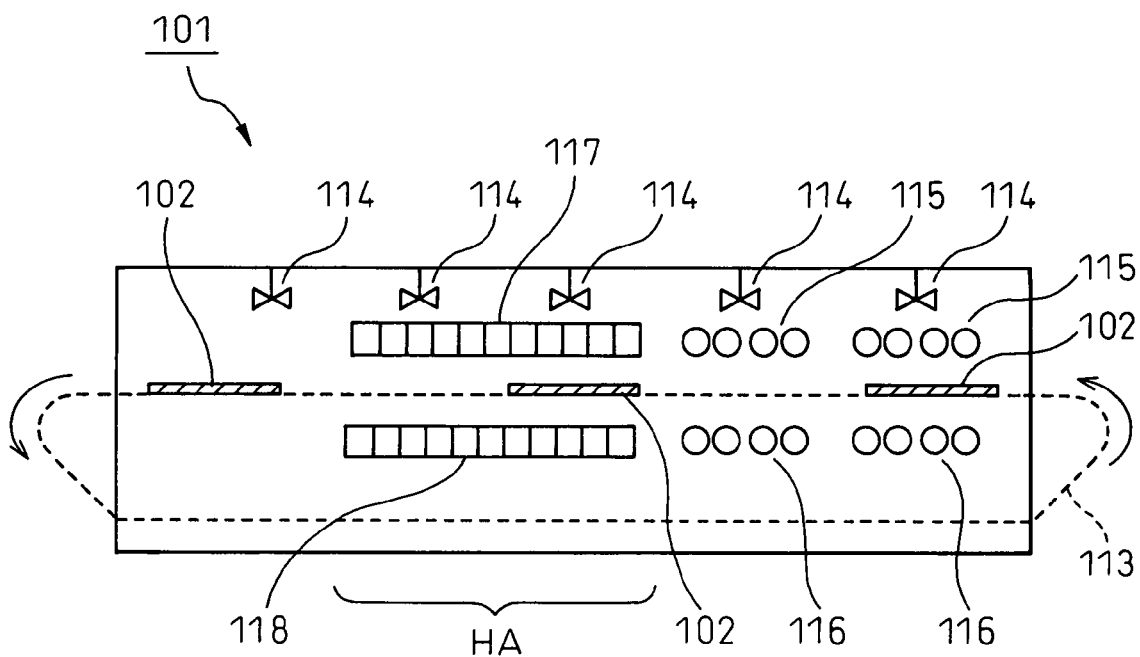
FIG. 3 is a view schematically illustrating another conventional reflowing apparatus.

That is, the heating wires of the heater unit 32 are connected to the receiving terminals 315 constituted by metal plates via wirings 313 and receive the supply of electric power from, for example, feeder rails (not shown) arranged in the furnace body through power source feed plugs 314 provided on the receiving terminals 315. As described above, the shape, size and the number of the heater unit 32 can be varied in various ways. The electric power can be supplied to the heater unit 32 based on various methods that have been known. Here, the electric power may be supplied to the heater unit 32, for example, in the main heating zone HA only in the reflowing apparatus of FIG. 3 described above.

FIG. 10 is a view illustrating how to control the moving heating units in the reflowing apparatus according to the embodiment of the present invention.

In the reflowing apparatus of this embodiment as shown in FIG. 10, first, the moving heaters 3 are held on a moving heater loader 13 in a standby state so as to maintain synchronism with the printed wiring boards 2. As the line sensor 18 detects the printed wiring board 2, the moving heater 3 is loaded into the reflowing furnace at the same conveying speed as that of the printed wiring board 2.

Here, the speed for conveying the moving heater 3 has been set to be equal to the speed for conveying the printed wiring board 2. Upon taking synchronism at the time of loading, therefore, the moving heater 3 is conveyed just under the printed wiring board 2 in the furnace at all times. The moving heater 3 locally elevates the temperature of the hot air blown to the low-temperature portion of the printed wiring board 2 as described above.

After the reflowing has been completed, a moving heater unloader 17 recovers the moving heater 3; i.e., the moving heater 3 is returned back to the moving heater loader 16 passing through under the conveyer, and the same processing is repeated. The printed wiring boards 2 can be conveyed based on various constitutions that have heretofore been known.

In the reflowing apparatus of the present invention described above, for example, the moving heater 3 may be, further, provided with the shielding plate 104 (hot air-shielding unit) described with reference to FIG. 2 enabling the temperature of the hot air to be locally elevated by the heater unit 32 not only to heat the low-temperature portion of the printed wiring board but also to suppress an excess rise of temperature at the high-temperature portions of the printed wiring board by shielding the hot air by the hot air-shielding unit. That is, the reflowing apparatus of the present invention makes it possible to locally elevate the temperature of the hot air by using the heater unit 32 while adopting the traditional method of controlling the temperature by using the shielding plate.

According to the present invention, it is made possible to reflow the whole printed wiring board without causing parts to be heated in excess of their bearable temperatures by lowering the dispersion of temperature at the time of soldering that stems from the kinds and sizes of parts mounted on the printed wiring board and from the difference in the degree of packaging density.

The present invention can be widely applied to the reflowing apparatuses for mounting parts on the printed wiring board by the hot air and can be, particularly, applied to the reflowing apparatus that effects the reflow soldering by using a lead-free solder which requires the treatment at a temperature higher than that of the ordinary solders.

What is claimed is:

1. A reflowing apparatus for mounting parts on a printed wiring board, comprising:
    a fixed heating portion configured to blow the hot air to said printed wiring board; and
    a moving heating portion moved by a conveyor and configured to locally vary the temperature of the hot air blown by said fixed heating portion to said printed wiring board, wherein
    said moving heating portion comprises:
        a base portion configured to pass the hot air from said fixed heating portion, and
        a heater unit movable to any position on said base portion, wherein the heater unit is supplied with electric power and configured to locally elevate the temperature of the hot air blown by said fixed heating portion to a low-temperature portion of said printed wiring board.

2. The reflowing apparatus as claimed in claim 1, further comprising a board conveyer configured to convey said printed wiring board, wherein said moving heating portion moves in synchronism with the printed wiring board conveyed by said board conveyer.

3. The reflowing apparatus as claimed in claim 2, wherein said moving heating portion is provided either over or under said printed wiring board that is conveyed.

4. The reflowing apparatus as claimed in claim 2, wherein said moving heating portions are provided both over and under said printed wiring board that is conveyed.

5. The reflowing apparatus as claimed in claim 1, wherein said heater unit is supplied with the electric power in the main heating zone only to elevate the temperature of the low-temperature portion of said printed wiring board.

6. The reflowing apparatus as claimed in claim 1, wherein said base portion comprises a punched plate or a mesh plate.

7. A reflowing apparatus for mounting parts on a printed wiring board, comprising:
    a fixed heating portion configured to blow the hot air to said printed wiring board; and
    a moving heating portion configured to locally vary the temperature of the hot air blown by said fixed heating portion to said printed wiring board, wherein
    said moving heating portion comprises:
        a base portion configured to pass the hot air from said fixed heating portion, and
        a hot air-shielding unit arranged at any position on said base portion, wherein the hot-air shielding unit is configured to locally lower the temperature of the high-temperature portion of said printed wiring board by shielding the hot air that is blown from said fixed heating portion to said high-temperature portion.

8. A reflowing method for mounting parts on a printed wiring board comprising the steps of:
    blowing the hot air from a fixed heating portion onto said printed wiring board, and
    locally varying the temperature of the hot air blown from said fixed heating portion moved by a conveyor and to said printed wiring board by using a moving heating portion moved by a conveyor and, wherein said moving heating portion comprises:

a base portion configured to pass the hot air from said fixed heating portion, and a heater unit movable to any position on said base portion, wherein the heater unit is supplied with electric power and configured to locally elevate the temperature of the hot air blown by said fixed heating portion to a low-temperature portion of said printed wiring board.

9. The reflowing method as claimed in claim 8, wherein said printed wiring board is conveyed by a board conveyer, and said moving heating portion moves in synchronism with the printed wiring board conveyed by said board conveyer.

10. The reflowing method as claimed in claim 9, wherein said moving heating portion is provided either over or under said printed wiring board that is conveyed.

11. The reflowing method as claimed in claim 9, wherein said moving heating portions are provided both over and under said printed wiring board that is conveyed.

12. The reflowing method as claimed in claim 8, wherein said heater unit is supplied with the electric power in the main heating zone only to elevate the temperature of the low-temperature portion of said printed wiring board.

13. The reflowing method as claimed in claim 8, wherein said base portion comprises a punched plate or a mesh plate.

14. A reflowing method for mounting parts on a printed wiring board comprising the steps of:

blowing the hot air from a fixed heating portion onto said printed wiring board, and locally varying the temperature of the hot air blown from said fixed heating portion moved by a conveyor and to said printed wiring board by using a moving heating portion moved by a conveyor and, wherein said moving heating portion comprises:

a base portion configured to pass the hot air from said fixed heating portion, and a hot air-shielding unit movable to any position on said base portion, wherein the hot air-shielding unit is configured to locally lower the temperature of the high-temperature portion of said printed wiring board by shielding the hot air that is blown from said fixed heating portion to said high-temperature portion.

* * * * *